United States Patent
Van Boxmeer et al.

(10) Patent No.: US 7,869,022 B2
(45) Date of Patent: Jan. 11, 2011

(54) INSPECTION METHOD AND APPARATUS LITHOGRAPHIC APPARATUS, LITHOGRAPHIC PROCESSING CELL, DEVICE MANUFACTURING METHOD AND DISTANCE MEASURING SYSTEM

(75) Inventors: Johan Maria Van Boxmeer, Sint Oedenrode (NL); Henricus Petrus Maria Pellemans, Veldhoven (NL); Robert Franken, Deurne (NL)

(73) Assignee: ASML Netherlands B.V., Veldhoven (NL)

( * ) Notice: Subject to any disclaimer, the term of this patent is extended or adjusted under 35 U.S.C. 154(b) by 186 days.

(21) Appl. No.: 11/826,830

(22) Filed: Jul. 18, 2007

(65) Prior Publication Data

US 2009/0021708 A1    Jan. 22, 2009

(51) Int. Cl.
*G01N 21/00* (2006.01)
*G02B 27/40* (2006.01)

(52) U.S. Cl. ............... 356/237.2; 356/609; 356/624; 250/201.4

(58) Field of Classification Search ... 356/237.1–237.6, 356/624, 609; 250/201.2, 201.4, 201.7, 201.8, 250/548, 237 R, 237 G; 369/97, 95, 78.02
See application file for complete search history.

(56) References Cited

U.S. PATENT DOCUMENTS

| | | | | |
|---|---|---|---|---|
| 4,435,055 A * | 3/1984 | Berdat et al. | | 396/105 |
| 4,475,182 A * | 10/1984 | Hosaka | | 369/44.36 |
| 4,866,262 A * | 9/1989 | van der Werf et al. | | 250/201.4 |
| 5,134,298 A * | 7/1992 | Inagaki et al. | | 250/491.1 |
| 5,187,696 A | 2/1993 | Ishii et al. | | |
| 5,191,200 A | 3/1993 | van der Werf et al. | | 250/201.4 |
| 5,251,194 A * | 10/1993 | Yoshimoto et al. | | 369/44.26 |
| 5,673,101 A * | 9/1997 | Tenner et al. | | 355/53 |
| 5,696,589 A * | 12/1997 | Bernacki | | 356/630 |
| 5,801,832 A * | 9/1998 | Van Den Brink | | 356/500 |
| 5,926,266 A * | 7/1999 | Dorundo et al. | | 356/237.2 |
| 5,978,091 A * | 11/1999 | Jann et al. | | 356/613 |
| 6,115,345 A * | 9/2000 | Kato et al. | | 369/112.1 |
| 6,458,605 B1 * | 10/2002 | Stirton | | 438/7 |
| 6,596,984 B2 * | 7/2003 | Vrehen | | 250/234 |
| 6,690,636 B1 * | 2/2004 | Marchant | | 369/97 |
| 7,403,259 B2 | 7/2008 | Kruijswijk et al. | | |
| 7,547,495 B2 | 6/2009 | Verstappen et al. | | |
| 7,580,334 B2 * | 8/2009 | Kadowaki et al. | | 369/53.34 |
| 2006/0066855 A1 | 3/2006 | Boef et al. | | 356/401 |

(Continued)

FOREIGN PATENT DOCUMENTS

EP     1 628 164 A2     2/2006

(Continued)

OTHER PUBLICATIONS

Notice of Reasons for Rejection mailed Dec. 4, 2009 for Japanese Application No. 2008-180849, 4 pgs.

*Primary Examiner*—Sang Nguyen
(74) *Attorney, Agent, or Firm*—Sterne, Kessler, Goldstein & Fox P.L.L.C.

(57) ABSTRACT

A scatterometer has a focus sensor arranged to detect whether the target being measured is in a correct focal plane. A modulation is applied to a component of the focus sensor or the scatterometer such that a defocus as measured by the focus sensor varies according to a certain function. From knowledge of the modulation, the gain of the sensor can be calibrated.

17 Claims, 4 Drawing Sheets

U.S. PATENT DOCUMENTS

| | | |
|---|---|---|
| 2006/0157698 A1 | 7/2006 | Miyajima |
| 2007/0104050 A1 | 5/2007 | Ueda .................. 369/44.35 |

FOREIGN PATENT DOCUMENTS

| | | |
|---|---|---|
| EP | 1 628 164 A3 | 4/2006 |
| JP | 57-098139 A | 6/1982 |
| JP | 60-042984 A | 3/1985 |
| JP | 60-210733 | 10/1985 |
| JP | 61-065672 A | 4/1986 |
| JP | 62-146081 A | 6/1987 |
| JP | 2-089413 A | 3/1990 |
| JP | 2-246026 A | 10/1990 |
| JP | 02265025 A * | 10/1990 |
| JP | H2-265025 | 10/1990 |
| JP | 4-329079 A | 11/1992 |
| JP | 10-067742 | 3/1998 |
| JP | 2005-142576 A | 6/2005 |
| JP | 2006-40380 | 2/2006 |
| JP | 2006-146175 A | 6/2006 |
| JP | 2006-196716 A | 7/2006 |
| JP | 2007-173807 A | 7/2007 |

* cited by examiner

INSPECTION METHOD AND APPARATUS LITHOGRAPHIC APPARATUS, LITHOGRAPHIC PROCESSING CELL, DEVICE MANUFACTURING METHOD AND DISTANCE MEASURING SYSTEM

FIELD

The present invention relates to a method of inspection usable, for example, in the manufacture of devices by lithographic techniques and to a method of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, one or more parameters of the patterned substrate are typically measured, for example the overlay error between successive layers formed in or on the substrate. There are various techniques for making measurements of the microscopic structures formed in a lithographic process, including the use of a scanning electron microscope and various specialized tools. One form of specialized inspection tool is a scatterometer in which a beam of radiation is directed onto a target on the surface of the substrate and one or more properties of the scattered or reflected beam are measured. By comparing one or more properties of the beam before and after it has been reflected or scattered by the substrate, one or more properties of the substrate may be determined. This may be done, for example, by comparing the reflected beam with data stored in a library of known measurements associated with a known substrate property. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a set of monochromatic radiation beams and measures the intensity (or intensity ratio and phase difference in case of an ellipsometric configuration) of the scattered radiation as a function of angle. Alternatively, measurement signals of different wavelengths may be measured separately and combined at an analysis stage.

Many forms of optical sensor, including many scatterometers, should have the measurement beam correctly focused on the sensor. A Foucault knife edge or Foucault bi-prism (two prisms joined together to form an isosceles triangle) method is often used to measure whether a beam is in focus. In the knife edge method, the beam is brought to a focus in space adjacent a knife edge so that when correctly focused the beam just passes the knife edge and the falls on a split detector. When the beam is correctly focused the signals from the two halves of the split detector are equal but if the beam is out of focus part of it is blocked by the knife-edge and the signals will become unequal.

SUMMARY

The knife-edge method can be used with a feedback loop to find the correct focus signal with a high degree of accuracy but the gain of the error signal is often not well known and can vary with measurement conditions. This may require frequent, time consuming off-line calibration of the sensor and may lead to a slow sensor response.

It is desirable, for example, to provide an optical focus or position sensor that requires less frequent off-line calibration and/or can provide faster servo response.

According to an aspect of the invention, there is provided an inspection apparatus configured to measure a property of a substrate, the apparatus comprising:

a focus sensor arranged to generate a focus error signal indicative of a position of the substrate relative to an optimum focal plane;

a modulator arranged to impose an alternating signal on the focus error signal; and a gain determination circuit arranged to calculate a gain of the focus sensor from the focus error signal on which the alternating signal has been imposed.

According to an aspect of the invention, there is provided a method of measuring a property of a substrate, the method comprising:

generating a focus error signal indicative of a position of the substrate relative to an optimum focal plane using a focus sensor;

imposing an alternating signal on the focus error signal; and calculating a gain of the focus sensor from the focus error signal on which the alternating signal has been imposed.

According to an aspect of the invention, there is provided a lithographic apparatus, comprising:

an illumination optical system arranged to illuminate a pattern;

a projection optical system arranged to project an image of the pattern on to a substrate; and an inspection apparatus configured to measure a property of a substrate, the apparatus comprising:

a focus sensor arranged to generate a focus error signal indicative of a position of the substrate relative to an optimum focal plane;

a modulator arranged to impose an alternating signal on the focus error signal; and a gain determination circuit arranged to calculate a gain of the focus sensor from the focus error signal on which the alternating signal has been imposed.

According to an aspect of the invention, there is provided a lithographic cell comprising:

a coater arranged to coat a substrate with a radiation sensitive layer;

a lithographic apparatus arranged to expose an image onto the radiation sensitive layer of the substrate coated by the coater;

a developer arranged to develop an image exposed by the lithographic apparatus; and an inspection apparatus configured to measure a property of a substrate, the apparatus comprising:

a focus sensor arranged to generate a focus error signal indicative of a position of the substrate relative to an optimum focal plane;

a modulator arranged to impose an alternating signal on the focus error signal; and a gain determination circuit arranged to calculate a gain of the focus sensor from the focus error signal on which the alternating signal has been imposed.

According to an aspect of the invention, there is provided a device manufacturing method comprising:

using a lithographic apparatus to form a pattern on a substrate; and determining a value related to a parameter of the formed pattern by:

generating a focus error signal indicative of a position of the substrate relative to an optimum focal plane using a focus sensor;

imposing an alternating signal on the focus error signal; and calculating a gain of the focus sensor from the focus error signal on which the alternating signal has been imposed.

According to an aspect of the invention, there is provided a distance measuring system arranged to measure a distance between a target and a reference, the system comprising:

a sensor arranged to output a signal having a value indicative of the distance;

a modulator arranged to vary the distance as measured by the sensor according to a known cyclic function; and a signal processor arranged to, responsive to the signal output by the sensor and the known cyclic function, determine therefrom a relationship between the value of the signal and the actual distance between the target and the reference.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
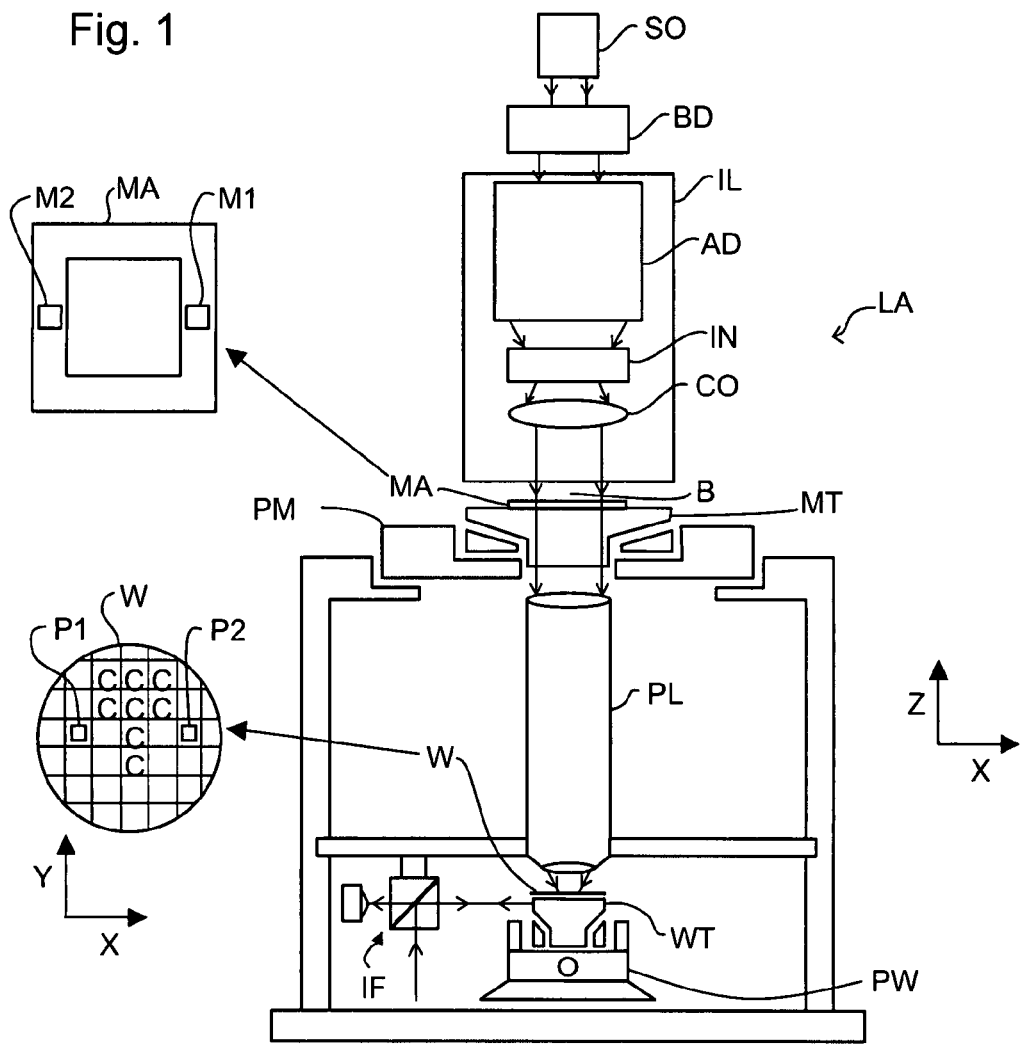
FIG. 1 depicts a lithographic apparatus.

FIG. 1 schematically depicts a lithographic apparatus. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
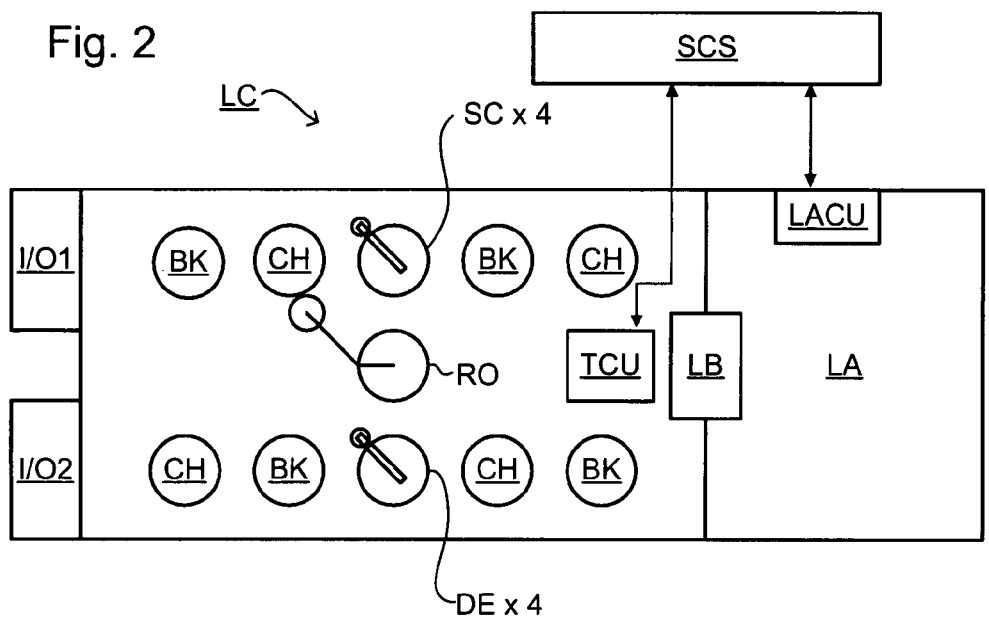
FIG. 2 depicts a lithographic cell or cluster.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

Figure 3:
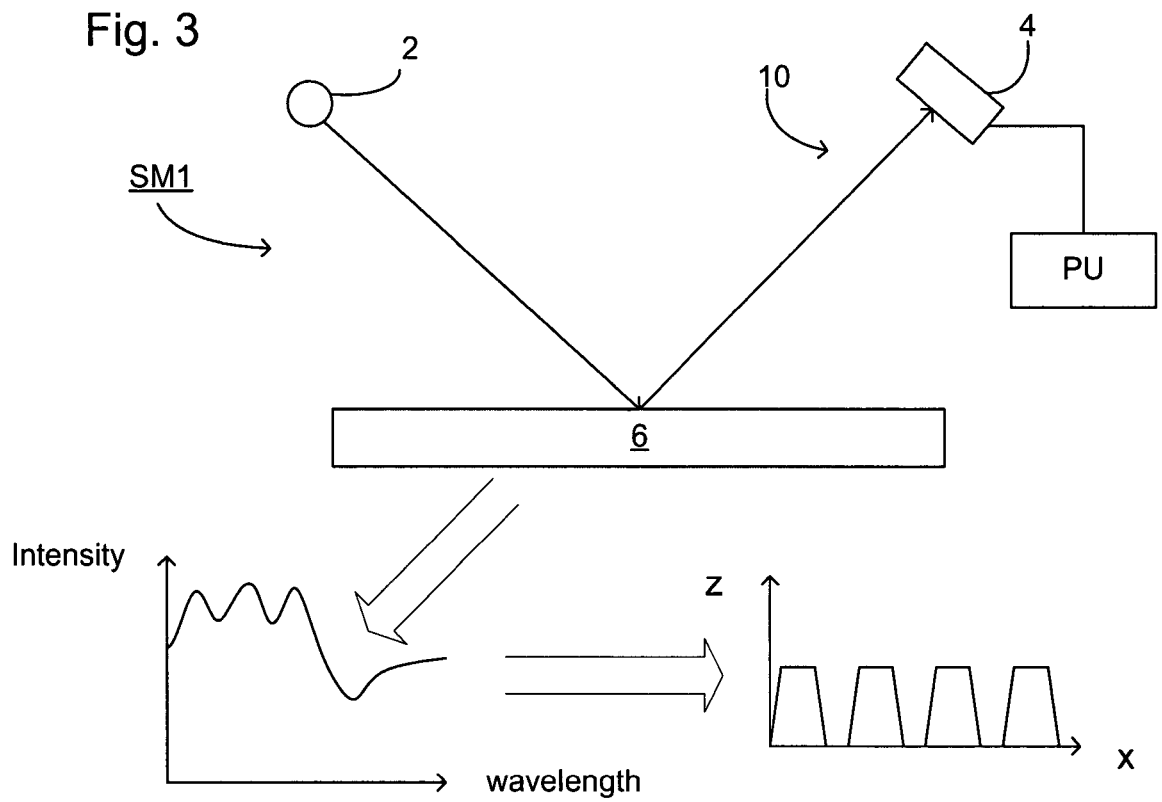
FIG. 3 depicts a first scatterometer.

FIG. 3 depicts a scatterometer SM1 according to an embodiment of the invention. It comprises a broadband (white light) radiation projector 2 which projects radiation onto a substrate 6. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer. The scatterometer includes a focus detection branch (not shown in the drawing) equivalent to that described below with reference to FIG. 4.

Figure 4:
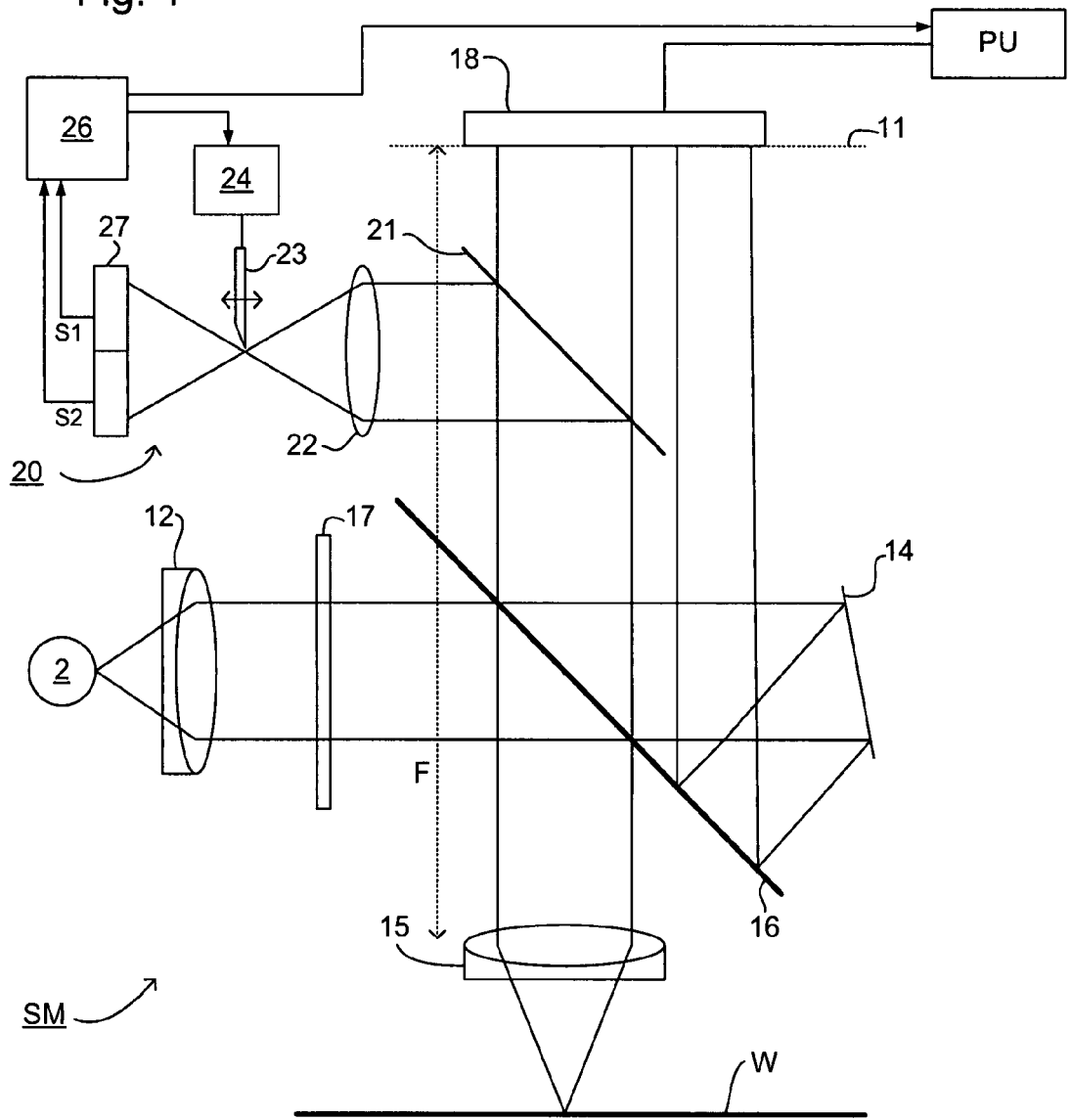
FIG. 4 depicts a second scatterometer.

Another scatterometer SM2 according to an embodiment of the invention is shown in FIG. 4. In this device, the radiation emitted by radiation source 2 is focused using lens system 12 through interference filter 13 and polarizer 17, reflected by partially reflective surface 16, or more generally beam splitter 16, and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic- and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

In any of the scatterometers described above, the target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes.

To enable detection of whether the scatterometer SM is properly focused, a focus detection branch 20 is provided. The focus detection branch comprises a second beamsplitter 21 to divert a portion of the main measurement beam into the focus detection branch, a lens or optical system 22 to focus the diverted beam to an intermediate focus adjacent a knife edge 23 and a split detector 27 in the path of the divergent beam after the intermediate focus. The operation of the focus detection branch can be explained with reference to FIGS. 5 and 6, which are enlargements of part of the focus detection branch.

Figure 5:
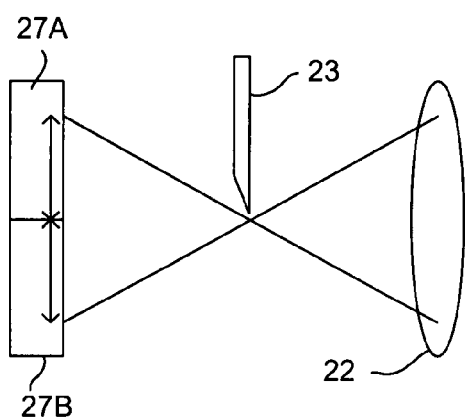
FIGS. 5 and 6 depict the principle of operation of a Foucault knife edge.
Figure 6:
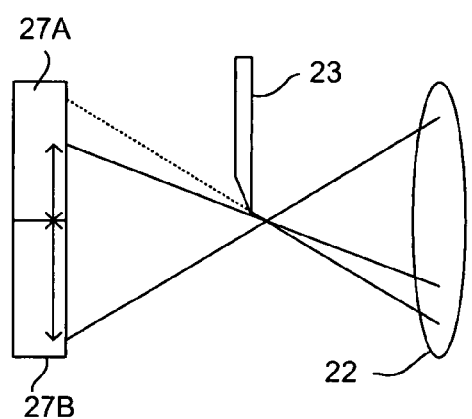

As shown in FIG. 5, the optics of the scatterometer are set up so that if the substrate W is in the correct focus, the intermediate focus created by optical system 22 lies exactly adjacent knife edge 23 so that no radiation in the beam is blocked and the two halves 27A, 27B of the split detector 27 receive the same amount of radiation. The output signals S1, S2 of the split detectors are subtracted in servo and control circuit 26 giving a zero error signal in the case of correct focus. However, as shown in FIG. 6, if the substrate W is out of focus, the intermediate focus formed by optical system 22 is shifted axially and part of the beam is blocked by the knife edge 23 so that unequal amounts of radiation fall on the two halves of the split detector 27. Subtraction of the two signals S1 and S2 gives a non-zero error signal whose sign, in principle, indicates in which direction the substrate W is out of focus.

A simple feedback loop can be used to control the relative position of the objective lens 15 and the substrate W so as to bring the substrate W into focus. However, correct functioning of such a feedback loop requires knowledge of the gain of the error signal. This can be determined by calibration but may drift with time and calibration values obtained using one or more test substrates may not be valid for an actual process substrate.

Figure 7:
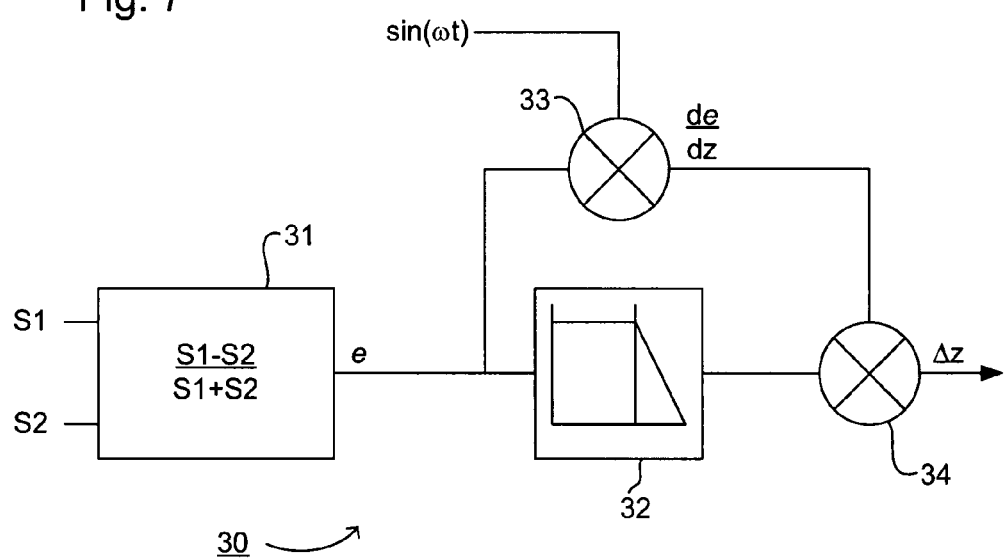
FIG. 7 depicts a servo control loop.

To determine the gain, according to an embodiment of the invention, a known modulation is applied to the focus of the apparatus, in a particular embodiment by imparting an oscillatory motion along the optical axis of the focus detection branch to the knife edge 23. Actuator 24, which may be a piezoelectric actuator, a voice coil, a linear motor or a rotary motor and cam, for example, is controlled by servo and control circuit 26 for this purpose. The latter circuit also effects a servo system as shown in FIG. 7.

In the servo system 30, the output signals S1, S2 from the split detector 27 are subtracted and the difference divided by their sum to generate a normalized error signal e. This signal has two components, one proportional to the actual focus error, which in general is constant or varies only with a low frequency, and a second component proportional to the modulation effected by oscillating the knife edge. The normalized error signal e is passed to a first multiplier 33 and a bandpass, or low pass, filter 32. Filter 32 has its cut-off frequency set so as to remove from the error signal e the modulation caused by the oscillation of the knife edge 23 and also any high frequency noise. First multiplier 33 multiplies the unfiltered error signal by the derivative of the modulation signal, for example a simple sinusoidal with frequency ω, to obtain the differential $$\frac{de}{dz}$$

which is the gain of the sensor 27. This is then multiplied by the filtered error signal e to obtain the underlying focus error Δz which can be used to correct the relative position of the objective lens 15 and substrate W.

Figure 8:
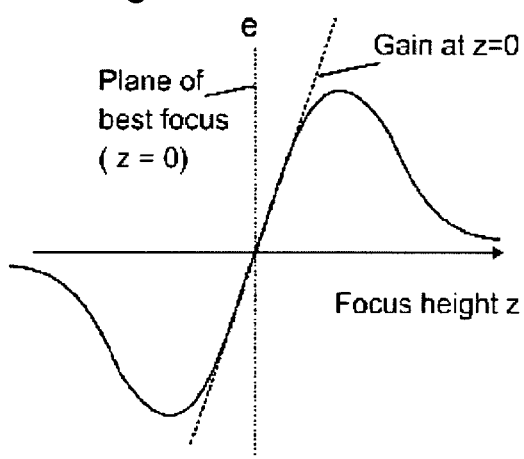
FIGS. 8 and 9 are graphs of focus error signal vs. defocus in two different situations.
Figure 9:
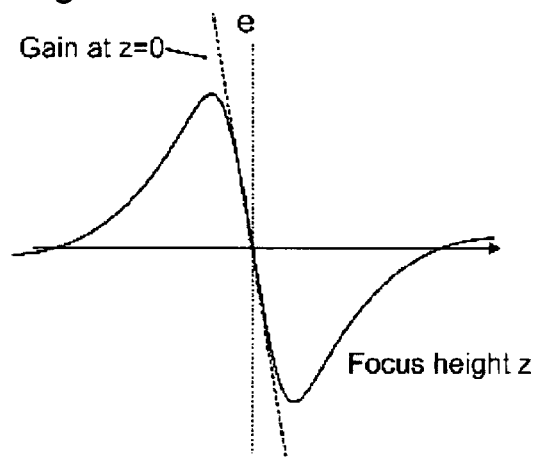

An advantages of embodiment of the present invention can be seen by reference to FIGS. 8 and 9. In normal circumstances, the focus error signal e as a function of defocus is as shown in FIG. 8. In a region close to the plane of best focus the signal is near linear with a positive slope indicated by the dotted line. However, measurement targets with a strong first order diffraction can produce different behavior and in extreme cases the slope of the response near the plane of best focus can reverse, as shown in FIG. 9. A simple feedback loop will not settle on the correct position in such extreme cases and will only settle slowly when the slope of the response is of the correct sign but different than expected, reducing throughput of the measurement apparatus. With an embodiment of the invention, the slope of the focus error response is determined and a focus error can be corrected rapidly, even if the slope of the focus error response is reversed.

In an embodiment of the invention, the amplitude of the modulation is small enough not to disturb measurements of the scatterometer SM and not to exceed the near-linear range of the focus error response curve. It is also possible to employ a larger amplitude of modulation and switch it off just before measurements are made, the gain being stored in a memory or buffer. In most cases the gain will not vary during the time taken for a scatterometric measurement to be made. It is also possible to switch off the modulation whilst the scatterometer is being scanned across a substrate (or vice versa) to find a measurement target. This can avoid rapidly changing gains causing instability. It is also possible to use the gain measurement of an embodiment of the invention as an indicator of an anomalous situation, such as a malformed target.

The frequency of the modulation is desirably above the bandwidth of the servo control loop, which may for example be 30 Hz. In a particular embodiment it can be set to be a multiple of a highest eigen or resonant frequency of the focus error correction mechanism. Thus the frequency of the modulation may be greater than or equal to 60 Hz, 90 Hz, 120 Hz or 150 Hz.

In the above described embodiment, the focus modulation is achieved by moving the knife edge 23. It is also or alternatively possible to move one or more other components, such as the sensor 27, the optical system 22, objective lens 15, the substrate W, an astigmatic lens, or a pinhole, as is convenient. A suitable modulation can also be accomplished by introducing a variable phase delay at a suitable point in the optical path, e.g. by rotating or selectively introducing into the beam a plane plate or optical wedge. An electro-optic modulator or Pockels cell may be suitable in some applications.

The principle of an embodiment of the invention may also be applied to other types of focus sensor (e.g. a confocal sensor, astigmatic sensor, triangulating sensor), a focus sensor in other devices, to other optical and non-optical distance sensors, such as an off-line level sensor in a lithographic apparatus.

In an off-line level sensor the height variations in the upper surface of a substrate to be exposed are measured by scanning the substrate under a level sensor. For optimum accuracy, the vertical (z) position and tilt of the substrate are controlled as the substrate is scanned so as to keep its upper surface at the zero or reference level of the height sensor and the height variations are determined from the movements of the substrate table necessary to keep the substrate surface at the reference level. However, such an approach limits the speed of the scan due to the vertical and tilt movements. Therefore it is desirable to provide the level sensor with a linear range, e.g. by calibration, so that the vertical and tilt movements only need to keep the substrate surface in the linear range and faster scan speeds can be accommodated. A problem with such arrangements is that the calibration of the linear range of the level sensor is performed using a reference substrate and the calibration may not be valid for an actual production substrate due to the effects of process layers.

By applying an embodiment of the present invention to such a level sensor, the level sensor can be effectively calibrated at the same time as the height and tilt measurements are made, avoiding any errors caused by differences between production and reference substrates. Thus a modulation is applied to the height measurement at a frequency higher than the height variation of the substrate as it is scanned relative to the sensor. The known modulation is used to determine the gain of the level sensor, then filtered out to enable measurement of the underlying substrate contour. The modulation can be applied in various ways: by movement of the substrate table; by movement of a component of the level sensor such as a folding mirror or grating; by movement of the detector; by movement and/or introduction of a plane plate or wedge; or by an electro-optical modulator or Pockels cell.

In a non-optical sensor, such as an air gauge or a capacitive sensor, the known modulation can be applied by moving a sensor head or the target. As discussed above, the modulation should be within the measurement range of the sensor and at a frequency detectable by the sensor but sufficiently different than expected movements in the target so as to be distinguishable therefrom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An inspection apparatus configured to measure a property of a substrate, the apparatus comprising:
   a focus sensor arranged to generate a normalized focus error signal indicative of a position of the substrate relative to an optimum focal plane;
   a multiplier arranged to combine an alternating signal with the normalized focus error signal;
   a filter arranged to generate a filtered error focus signal from the normalized focus error signal;
   a gain determination circuit arranged to calculate a gain of the focus sensor from the normalized focus error signal on which the alternating signal has been imposed; and
   a mixer arranged to combine the gain of the focus sensor with the filtered error focus signal to generate a focus error signal.

2. The apparatus of claim 1, wherein the focus sensor is an optical sensor.

3. The apparatus of claim 1, wherein the modulator comprises an actuator arranged to impart an oscillatory motion to a component of the focus sensor.

4. The apparatus of claim 3, wherein the component that is oscillated is selected from the group comprising: a knife-edge, an objective lens, an astigmatic lens, a pinhole, the substrate, a folding mirror, a detection grating, an optical detector, a plane plate, or a wedge.

5. The apparatus of claim 1, wherein the modulator comprises an electro-optical modulator or a Pockels cell.

6. The apparatus of claim 1, further comprising a filter arranged to filter the focus error signal to remove the alternating signal.

7. The apparatus of claim 1, further comprising a servo circuit arranged to adjust the position of the substrate in response to the focus error signal and the gain calculated by the gain determination circuit.

8. The apparatus of claim 7, further comprising a control circuit arranged to control the modulator to not impose the alternating signal while the inspection apparatus is measuring a property of the substrate and a memory arranged to store at least one value of the gain calculated by the gain determination circuit.

9. The apparatus of claim 1, wherein the inspection apparatus is a scatterometer.

10. The apparatus of claim 1, wherein the inspection apparatus is a level sensor.

11. The method of claim 1, wherein imposing an alternating signal is performed using an electro-optical modulator or a Pockels cell.

12. A method of measuring a property of a substrate, the method comprising:
- generating a normalized focus error signal indicative of a position of the substrate relative to an optimum focal plane using a focus sensor;
- multiplying an alternating signal with the normalized focus error signal;
- filtering the normalized focus error signal;
- calculating, using a control circuit, a gain of the focus sensor from the normalized focus error signal on which the alternating signal has been imposed; and
- combining the gain of the focus sensor with the filtered error focus signal to generate a focus error signal.

13. The method of claim 12, wherein imposing an alternating signal comprises imparting an oscillatory motion to a component of the focus sensor.

14. The method of claim 13, wherein the component that is oscillated is selected from the group comprising: a knife-edge, an objective lens, an astigmatic lens, a pinhole, the substrate, a folding mirror, a detection grating, an optical detector, a plane plate, or a wedge.

15. The method of claim 12, further comprising filtering the focus error signal to remove the alternating signal.

16. The method of claim 12, further comprising adjusting the position of the substrate in response to the focus error signal and the calculated gain.

17. The method of claim 16, wherein the imposing an alternating signal is not performed while measuring a property of the substrate and further comprising storing at least one value of the calculated gain.

* * * * *